(12) United States Patent
Kawai et al.

(10) Patent No.: US 6,590,199 B2
(45) Date of Patent: Jul. 8, 2003

(54) OPTICAL INFORMATION PROCESSING APPARATUS FOR USE IN OPTICAL COMPUTING, OPTICAL IMAGE PROCESSING, AND LIKE

(75) Inventors: Hideo Kawai, Sagamihara (JP); Kazushi Higashi, Neyagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 178 days.

(21) Appl. No.: 09/749,600

(22) Filed: Dec. 28, 2000

(65) Prior Publication Data
US 2001/0006219 A1 Jul. 5, 2001

(30) Foreign Application Priority Data

Dec. 28, 1999 (JP) ............................................ 11-372574

(51) Int. Cl.[7] .......................... H01L 31/00; H01L 31/14
(52) U.S. Cl. .................................... 250/214.1; 250/553
(58) Field of Search ............................ 250/206, 208.2, 250/210, 214.1, 214 R, 214 L, 214 LS, 552, 553

(56) References Cited

U.S. PATENT DOCUMENTS 5,160,837 A * 11/1992 Hirane et al. ............ 250/208.2

2001/0006219 A1 * 7/2001 Kawai et al. ............ 250/553

FOREIGN PATENT DOCUMENTS

| EP | 1115155 | * | 7/2001 | |
| EP | 1 115 155 | * | 11/2001 | ............ 250/214.1 |
| JP | 59-4161 | * | 1/1984 | ............ 257/84 |
| JP | 8-249715 | | 9/1996 | |

* cited by examiner

Primary Examiner—Huy Mai
(74) Attorney, Agent, or Firm—Browdy and Neimark, P.L.L.C.

(57) ABSTRACT

An optical information processing apparatus for use in optical computing, optical image processing, and the like and, more particularly, a small-sized integrated optical information processing apparatus having multiple arrays, a high pixel density and a large number of pixels. The optical information processing apparatus includes a light emitting device array 11 in which light emitting devices 6 are inserted in through holes provided in a silicon substrate for receiving light emitting devices, a semiconductor arithmetic circuit chip 17, and a glass substrate 16 provided with diffraction type optical devices. Thus, a small-sized optical information processing apparatus having multiple arrays and a high pixel density can be realized.

21 Claims, 3 Drawing Sheets

OPTICAL INFORMATION PROCESSING APPARATUS FOR USE IN OPTICAL COMPUTING, OPTICAL IMAGE PROCESSING, AND LIKE

BACKGROUND OF THE INVENTION

1. Field of the Invention

The present invention relates to an optical information processing apparatus for use in optical computing, optical image processing, and the like.

2. Description of Prior Art

For example, the invention disclosed in the specification of Japanese Patent Application No. H10-113148 is an example of an integrated optical information processing apparatus in which light emitting devices are bonded onto a semiconductor arithmetic circuit chip to form a light emitting device array. The structure of the conventional optical information processing apparatus is illustrated in FIG. 1. In FIG. 1, reference numeral 63 denotes a semiconductor light emitting diode, reference numeral 14 a diffraction type collimator lens, reference numeral 15 a diffraction type focusing lens, reference numeral 16 a glass substrate provided with diffraction type optical devices, reference numeral 17 a semiconductor arithmetic circuit chip, reference numeral 18 a light emitting device driving electrode, reference numeral 19 a light receiving device, reference numeral 64 a gold bump, reference numeral 23 an input signal light beam, reference numeral 24 an output signal light beam, reference numeral 61 a cylindrical glass, and reference numeral 62 a light blocking resin.

The operation of the conventional optical information processing apparatus having such a structure as described above will now be described by illustrating the operation of one pixel among a plurality of arrays. First, the input signal light beam 23 is focused by the diffraction type focusing lens 15 provided on the glass substrate 16 provided with diffraction type optical devices onto the light receiving device 19 provided on the semiconductor arithmetic circuit chip 17 through the cylindrical glass 61. Thus, the input signal light beam 23 is incident upon the light receiving device 19. The light receiving device 19 converts the incident input signal light beam 23 into an electric signal. The semiconductor arithmetic circuit chip 17 receives as its input signal the converted electric signal from the light receiving device 19, and performs an arithmetic operation. The result of the arithmetic operation is output to the light emitting device driving electrode 18 as an electric signal. The electric output signal which is output to the light emitting device driving electrode 18 is then applied to the semiconductor light emitting diode 63 via the gold bump 64, and a current flows through the semiconductor light emitting diode 63 according to the electric output signal. The semiconductor light emitting diode 63 converts the electric output signal into the output signal light beam 24 according to the result of the arithmetic operation. The output signal light beam 24 from the semiconductor light emitting diode 63 is output through the diffraction type collimator lens 14 provided on the glass substrate 16 provided with diffraction type optical devices while suppressing the spatial divergence thereof. The light blocking resin 62 blocks light from a side surface of the semiconductor light emitting diode 63 so that light from the side surface of the semiconductor light emitting diode 63 is not incident upon adjacent light receiving devices 19.

However, such a conventional structure as described above has the following problems. When forming the light emitting device array by bonding the semiconductor light emitting diodes 63 onto the respective light emitting device driving electrodes 18, the bonding is performed while positionally aligning the individual semiconductor light emitting diodes 63 with respect to the respective light emitting device driving electrodes 18. As a result, as the number of pixels provided in an array increases, the number of misaligned semiconductor light emitting diodes 63 increases. Therefore, it is difficult to produce a light emitting device array including the semiconductor light emitting diodes 63 with a good precision.

Moreover, the cylindrical glasses 61 are bonded onto the respective light receiving devices 19 while positionally aligning the cylindrical glasses 61 with respect to the respective light receiving devices 19. As a result, as the number of pixels provided in an array increases, the number of misaligned cylindrical glasses 61 increases. Therefore, it is difficult to provide the array of cylindrical glasses 61 respectively defining optical paths on the light receiving devices 19 with a good precision.

Furthermore, with the light blocking technique using the light blocking resin 62, the light blocking effect is reduced as the interval between each semiconductor light emitting diode 63 and an adjacent light receiving device 19 is reduced. Therefore, it is difficult to reduce the pixel-to-pixel interval of the conventional optical information processing apparatus having such a structure as described above, and thus to increase the integration density of, and thereby reducing the size of, the optical information processing apparatus.

SUMMARY OF THE INVENTION

In order to solve these problems in the prior art, the present invention provides an optical information processing apparatus comprising a light emitting device array provided on a semiconductor arithmetic circuit chip, the light emitting device array comprising light emitting devices which are embedded in through holes in a silicon substrate. In addition to such a structure, the optical information processing apparatus of the present invention may additionally comprise a substrate provided with diffraction type optical devices, and further through holes provided in the silicon substrate for defining optical paths for light receiving devices.

Thus, an array of light emitting devices and optical paths for light receiving devices can be easily formed on the semiconductor arithmetic circuit chip with a good precision, thereby providing a small-sized integrated optical information processing apparatus having a large number of pixels.

According to a first aspect of the present invention, there is provided an optical information processing apparatus, comprising: a semiconductor arithmetic circuit chip; and a light emitting device array integrated onto the semiconductor arithmetic circuit chip, the light emitting device array comprising a substrate (e.g., a silicon substrate) having a through hole and a light emitting device embedded in the through hole. This apparatus functions as follows. The semiconductor arithmetic circuit chip performs an arithmetic operation. The result of the arithmetic operation is applied as an electric output signal to the light emitting device which is embedded in the through hole in the substrate which forms a part of the light emitting device array. The light emitting device is operable to convert the electric output signal into an output signal light beam and output the obtained light beam.

Thus, according to the present invention, it is possible to realize a small-sized integrated optical information processing apparatus having a high pixel density and a large number of pixels by employing the light emitting device array in which the light emitting devices are embedded in the through holes in the silicon substrate.

According to a second aspect of the present invention, there is provided an optical information processing apparatus, comprising: a semiconductor arithmetic circuit chip; a light emitting device array integrated onto the semiconductor arithmetic circuit chip; and a diffraction type optical device integrated onto the light emitting device array, the light emitting device array comprising a substrate having a through hole and a light emitting device embedded in the through hole. The diffraction type optical device functions to focus an input signal light beam and to suppress spatial divergence of the output signal light beam from the light emitting device.

According to a third aspect of the present invention, a light receiving device is provided on the semiconductor arithmetic circuit chip. The light receiving device functions to convert an input signal light beam into an electric signal.

According to a fourth aspect of the present invention, the substrate further comprises another through hole defining an optical path for the light receiving device. The through hole defining the optical path for the light receiving device functions to transmit the input signal light beam therethrough.

According to a fifth aspect of the present invention, the light emitting device is a semiconductor light emitting diode. The semiconductor light emitting diode functions to convert an electric output signal into an optical output signal.

According to a sixth aspect of the present invention, the light emitting device is a semiconductor laser diode. The semiconductor light emitting laser functions to convert an electric output signal into an optical output signal.

According to a seventh aspect of the present invention, the substrate is silicon. Such a structure has an advantage of facilitating the application of circuits to the substrate.

According to a eighth aspect of the present invention, an insulator film is provided on the surface of the substrate including a side surface of the through hole. The insulator film functions to prevent an electric output signal from flowing into the substrate.

According to a ninth aspect of the present invention, the substrate is a plastic, a ceramic, a glass, a semiconductor, a metal or a graphite. The optical information processing apparatus of the present invention can be realized by using any of these materials for the substrate as in the case where a silicon substrate is used. The use of these alternative materials has an advantage that the insulator film may be a silicon dioxide film or a silicon nitride film which is provided by using a vapor deposition apparatus, a sputtering apparatus or a plasma chemical vapor deposition apparatus.

According to a tenth aspect of the present invention, an insulator film is provided on the surface of the substrate including a side surface of the through hole. The insulator film functions to prevent an electric output signal from flowing into the substrate.

According to a eleventh aspect of the present invention, the insulator film is a silicon thermal oxide film. The silicon thermal oxide film functions to prevent an electric output signal from flowing into the substrate.

According to a twelfth aspect of the present invention, the insulator film is a silicon dioxide film. The silicon dioxide film functions to prevent an electric output signal from flowing into the silicon substrate.

According to a thirteenth aspect of the present invention, the insulator film is a silicon nitride film. The silicon nitride film functions to prevent an electric output signal from flowing into the silicon substrate.

Thus, an object of the present invention is to provide a small-sized integrated optical information processing apparatus by precisely and easily producing an array of light emitting devices and optical paths for light receiving devices on a semiconductor arithmetic circuit chip.

This and other objects of the present invention will be more apparent from the following description of the preferred embodiment with reference to the drawings.

DESCRIPTION OF THE PREFERRED EMBODIMENT

Figure 1:
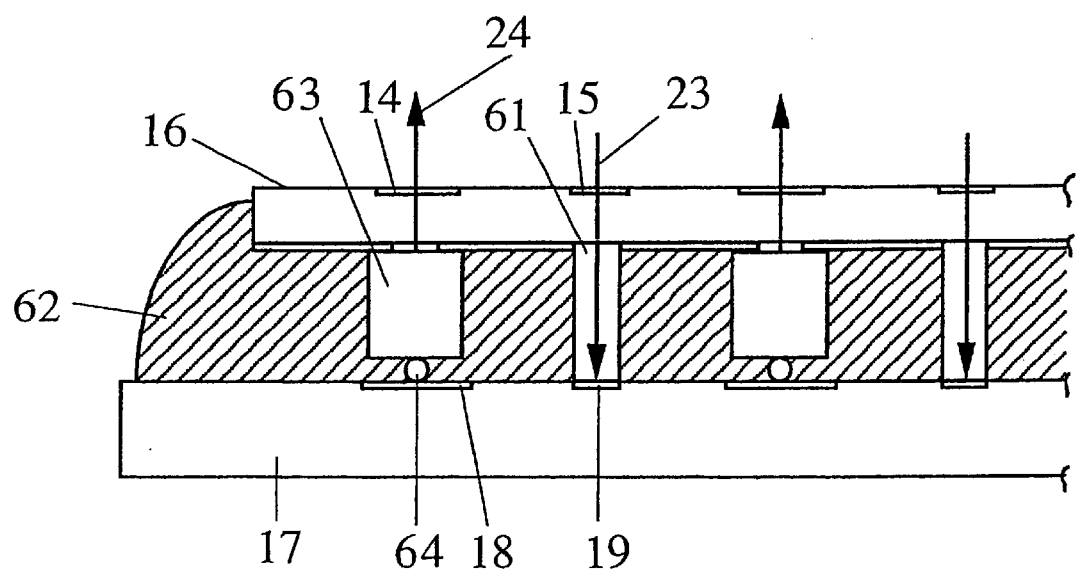
FIG. 1 is a cross-sectional view illustrating a conventional optical information processing apparatus.
Figure 2:
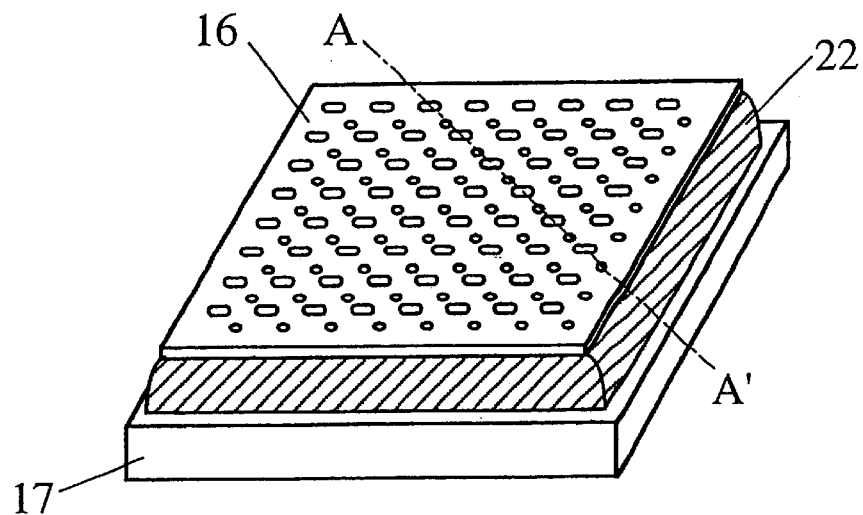
FIG. 2 is a perspective view illustrating an optical information processing apparatus according to one embodiment of the present invention.
Figure 3:
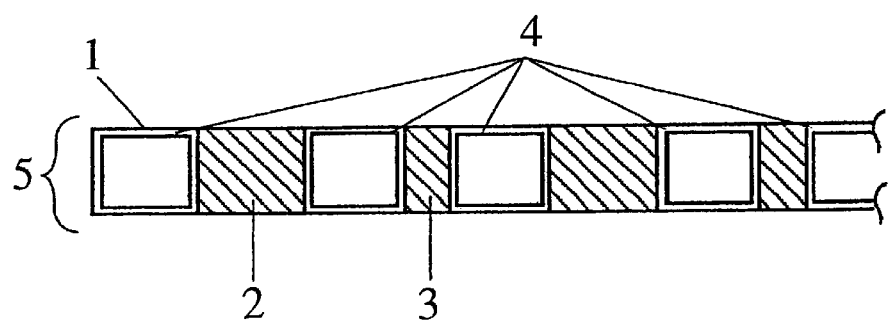
FIG. 3 is a cross-sectional view illustrating a device securing element which forms a part of an optical information processing apparatus according to one embodiment of the present invention.
Figure 4:
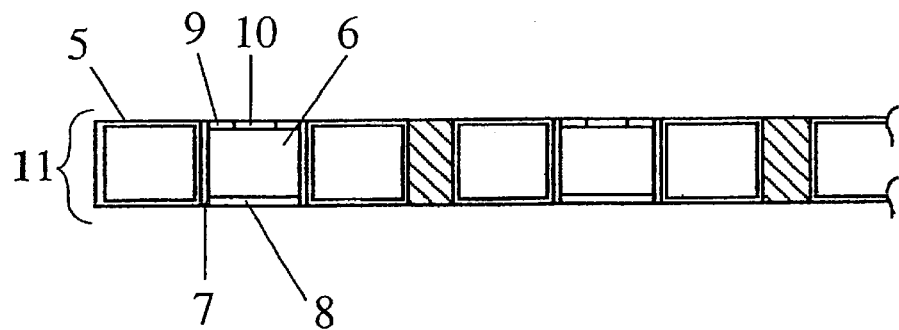
FIG. 4 is a cross-sectional view illustrating a light emitting device array which forms a part of an optical information processing apparatus according to one embodiment of the present invention.
Figure 5:
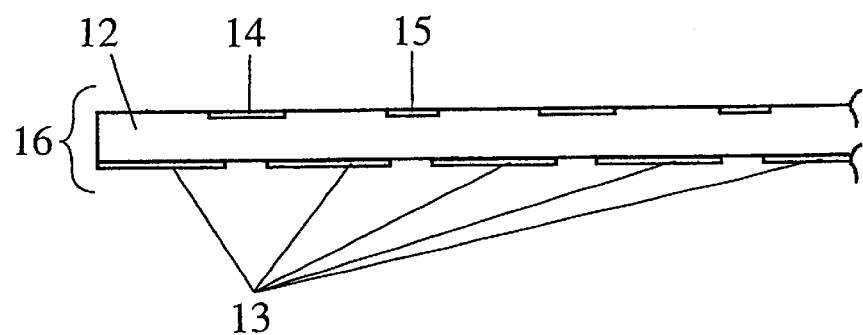
FIG. 5 is a cross-sectional view illustrating a glass substrate provided with diffraction type optical devices which forms a part of an optical information processing apparatus according to one embodiment of the present invention.
Figure 6:
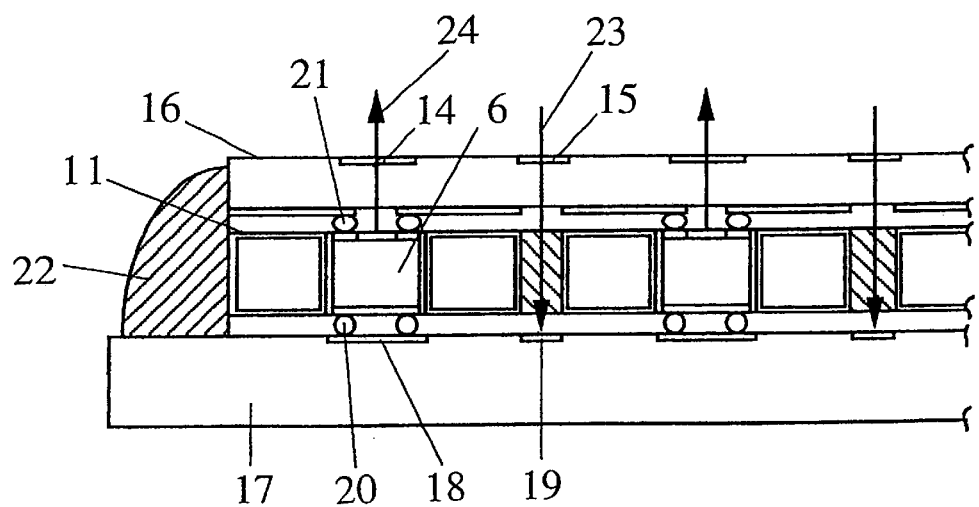
FIG. 6 is a cross-sectional view illustrating an optical information processing apparatus according to one embodiment of the present invention.

An embodiment of the present invention will now be described with reference to FIGS. 2 to 6. FIG. 2 is a perspective view illustrating an optical information processing apparatus according to one embodiment of the present invention. FIG. 3 is a cross-sectional view taken along broken line A–A' in FIG. 2, illustrating the structure of a device securing element which is one component of the optical information processing apparatus according to the present embodiment. FIG. 4 is a cross-sectional view taken along broken line A–A' in FIG. 2, illustrating the structure of a light emitting device array which is one component of the optical information processing apparatus according to the present embodiment in which the device securing element of FIG. 3 has been further processed. FIG. 5 is a cross-sectional view taken along broken line A–A' in FIG. 2, illustrating the structure of a glass substrate provided with diffraction type optical devices which is one component of the optical information processing apparatus according to the present embodiment. FIG. 6 is a cross-sectional view taken along broken line A-A' in FIG. 2, illustrating the structure of the optical information processing apparatus according to the present embodiment.

In FIG. 2, reference numeral 16 denotes a glass substrate provided with diffraction type optical devices, reference numeral 17 a semiconductor arithmetic circuit chip, and reference numeral 22 a securing resin for securing the various components from the semiconductor arithmetic circuit chip 17 (the lowermost component) to the glass substrate 16 provided with diffraction type optical devices (the uppermost component). In FIG. 3, reference numeral 1 denotes a silicon substrate, reference numeral 2 a through hole for receiving a light emitting device which is provided in the silicon substrate 1, reference numeral 3 a through hole defining an optical path for a light receiving device which is also provided in the silicon substrate 1, and reference numeral 4 an insulator film provided on the surface of the silicon substrate 1 including side surfaces of the light emitting device through hole 2 and the through hole 3 defining an optical path for a light receiving device. Reference numeral 5 denotes a device securing element including the silicon substrate 1, the light emitting device through hole 2, the through hole 3 defining an optical path for a light receiving device, and the insulator film 4. In FIG. 4, reference numeral 6 denotes a light emitting device inserted in the light emitting device through hole 2 of the device securing element 5, and reference numeral 7 an adhesive for securing the light emitting device 6 to the device securing element 5. Reference numeral 8 denotes an anode electrode of the light emitting device 6, reference numeral 9 a cathode electrode of the light emitting device 6, and reference numeral 10 a light exiting window of the light emitting device 6. Reference numeral 11 denotes a light emitting device array element in which the light emitting devices 6 are inserted into the light emitting device through holes 2 in the device securing element 5 and secured therein with the adhesive 7.

In FIG. 5, reference numeral 12 denotes a glass substrate which forms a part of the glass substrate 16 provided with diffraction type optical devices, reference numeral 13 electrodes provided on the lower surface of the glass substrate 12, reference numeral 14 a diffraction type collimator lens provided on the glass substrate 12, and reference numeral 15 a diffraction type focusing lens provided on the glass substrate 12. In FIG. 6, reference numeral 18 denotes a light emitting device driving electrode provided on the semiconductor arithmetic circuit chip 17, reference numeral 19 a light receiving device provided on the semiconductor arithmetic circuit chip 17, reference numeral 20 an electrically conductive bond for bonding together the light emitting device driving electrode 18 and the anode electrode 8 of the light emitting device 6, and reference numeral 21 an electrically conductive bond for bonding together the cathode electrode 9 of the light emitting device 6 and the electrode 13 provided on the lower surface of the glass substrate 12. The adhesive 22 holds together the semiconductor arithmetic circuit chip 17, the light emitting device array 11 and the glass substrate 16 provided with diffraction type optical devices. Reference numeral 23 denotes an input signal light beam incident upon the light receiving device 19, and reference numeral 24 an output signal light beam which is output from the light emitting device 6.

The semiconductor arithmetic circuit chip 17 is produced by using a silicon integrated circuit formation technique, and includes, for each pixel, an arithmetic circuit (not shown), a light emitting device driving circuit (not shown), the light emitting device driving electrode 18 and the light receiving device 19.

A non-doped silicon substrate having a low electric conductivity is used for the silicon substrate 1. The light emitting device through holes 2 are each sized to the outer shape of the light emitting device 6 so that the light emitting device 6 can be inserted therein, and are positionally aligned with the light emitting device driving electrodes 18 on the semiconductor arithmetic circuit chip 17. The through holes 3 defining optical paths for light receiving devices are sized and positioned according to the area and the positions of the light receiving devices 19. The light emitting device through holes 2 and the through holes 3 defining optical paths for light receiving devices are provided through a dry etching process with a reactive gas containing fluorine element while using a mask which is obtained by patterning a photoresist or a metal film. The insulator film 4 on the surface of the silicon substrate 1 is provided by heating the silicon substrate 1 in a water vapor atmosphere so as to allow formation of a silicon thermal oxide film thereon.

A semiconductor light emitting diode or a semiconductor laser diode whose emission wavelength is 900 nm or less so that the emitted light is not transmitted through the silicon substrate 1 is used for the light emitting device 6.

The light emitting device array 11 is an array of the light emitting devices 6 which is obtained by inserting the light emitting devices 6 in the light emitting device through holes 2 provided in the device securing element 5 and securing the light emitting devices 6 in the light emitting device through holes 2 by the adhesive 7. An electrically insulative adhesive is used for the adhesive 7 so as not to influence the light emitting devices 6.

The electrodes 13 on the lower surface of the glass substrate 12 are patterned according to the sizes and positions of the light exiting windows 10 of the light emitting devices 6 and the light receiving devices 19 so that the electrodes 13 can transmit the input signal light beam 23 and the output signal light beam 24 therethrough.

The diffraction type collimator lenses 14 are provided on the upper surface of the glass substrate 12 according to the positions of the light exiting windows 10 of the light emitting devices 6. The diffraction type focusing lenses 15 are provided on the upper surface of the glass substrate 12 according to the positions of the light receiving devices 19.

A gold bump is used for the electrically conductive bonds 20 and 21. Alternatively, other electrically conductive adhesive such as a silver paste may be used. The adhesive 22 adheres to the respective side surfaces of the semiconductor arithmetic circuit chip 17, the light emitting device array 11 and the glass substrate 16 provided with diffraction type optical devices so as to hold together these elements. An electrically insulative adhesive is used for the adhesive 22 so as not to influence the electric circuits on the semiconductor arithmetic circuit chip 17 and the light emitting devices 6 embedded in the light emitting device array 11.

Next, the operation of the present embodiment will be described with reference to the cross-sectional views of FIGS. 3 to 6. The input signal light beam 23 is subjected to a focusing effect by the diffraction type focusing lens 15 provided on the glass substrate 16 provided with diffraction type optical devices so as to pass through the through holes 3 defining optical paths for light receiving devices provided in the device securing element 5 which forms a part of the light emitting device array 11 and be incident upon the light receiving device 19 on the semiconductor arithmetic circuit chip 17. The light receiving device 19 converts the incident input signal light beam 23 into an electric signal.

The semiconductor arithmetic circuit chip 17 receives as its input signal the converted electric signal from the light receiving device 19, and performs an arithmetic operation. The result of the arithmetic operation is output to the light emitting device driving electrode 18 as an electric output signal. The electric output signal to be output to the light emitting device driving electrode 18 is then applied to the anode electrode 8 of the light emitting device 6 via the electrically conductive bond 20, and a current flows through the light emitting device 6 according to the electric output signal. The current then flows out of the light emitting device 6, passes through the cathode electrode 9 of the light emitting device 6, and flows into the electrode 13 provided on the glass substrate 16 provided with diffraction type optical devices via the electrically conductive bond 21. The insulator film 4 provided on the surface of the silicon substrate 1 which forms a part of the device securing element 5 prevents the current flowing through the light emitting device 6 from flowing through the silicon substrate 1, thereby preventing the operation of the light emitting device 6 from becoming unstable.

The light emitting device 6 converts the electric output signal into the output signal light beam 24 according to the result of the arithmetic operation. The output signal light beam 24 emitted from the light exiting window 10 of the light emitting device 6 is output while the spatial divergence thereof is suppressed by the diffraction type collimator lens 14 provided on the glass substrate 16 provided with diffraction type optical devices. Any light which is emitted from the side surface of the light emitting device 6 during the emission of the light emitting device 6 is blocked by the silicon substrate 1 and thus prevented from being incident upon adjacent light receiving devices 19.

As described above, according to the present embodiment, a light emitting device array in which light emitting devices are embedded in through holes in a silicon substrate is integrated onto a semiconductor arithmetic circuit chip, whereby it is possible to precisely and easily produce the light emitting device array and optical paths for light receiving devices. Thus, the present embodiment realizes a small-sized integrated optical information processing apparatus having a large number of pixels (the number of pixels is greater than that in a conventional apparatus by a factor of 16 or more) and a high pixel density (the pixel density is greater than that in a conventional apparatus by a factor of 2 or more).

While the description above focuses on the operation of one pixel among a plurality of arrays, each of the other pixels in the array also operates in the same manner as described above.

In the description above, a silicon thermal oxide film is used for the insulator film on the surface of the silicon substrate. Alternatively, the insulator film may be a silicon dioxide film or a silicon nitride film provided by using a vapor deposition apparatus, a sputtering apparatus or a plasma chemical vapor deposition apparatus.

In the description above, silicon is used as the substrate. Alternatively, the substrate may be a plastic, a ceramic, a glass, a semiconductor, a metal or a graphite. In such a case, the insulator film may be a silicon dioxide film or a silicon nitride film provided by using a vapor deposition apparatus, a sputtering apparatus or a plasma chemical vapor deposition apparatus.

In the description above, the light emitting device includes a cathode electrode on the light exiting window side thereof and an anode electrode on the opposite side. Alternatively, the light emitting device may include the anode electrode on the light exiting window side thereof and the cathode electrode on the opposite side.

While the present invention has been described above based on a preferred embodiment thereof as illustrated in the accompanying drawings, it will be apparent that various modifications and improvements can be made thereto without departing from the spirit and scope of the present invention.

What is claimed is:

1. An optical information processing apparatus, comprising:
    a semiconductor arithmetic circuit chip; and a light emitting device array integrated onto the semiconductor arithmetic circuit chip,
    the light emitting device array comprising a substrate having a preformed through hole and a light emitting device inserted in the through hole.

2. The optical information processing apparatus according to claim 1, wherein a light receiving device is provided on the semiconductor arithmetic circuit chip.

3. The optical information processing apparatus according to claim 2, wherein the light emitting device is a semiconductor light emitting diode.

4. The optical information processing apparatus according to claim 2, wherein the light emitting device is a semiconductor laser diode.

5. The optical information processing apparatus according to claim 1, wherein the light emitting device is a semiconductor laser diode.

6. The optical information processing apparatus according to claim 1, wherein the substrate is silicon.

7. The optical information processing apparatus according to claim 1, wherein the substrate is one selected from the group consisting of a plastic, a ceramic, a glass, a semiconductor, a metal and a graphite.

8. The optical information processing apparatus according to claim 1, wherein the light emitting device is a semiconductor light emitting diode.

9. An optical information processing apparatus, comprising
    a semiconductor arithmetic circuit chip; a light emitting device array integrated onto the semiconductor arithmetic circuit chip; and
    a diffraction type optical device integrated onto the light emitting device array,
    the light emitting device array comprising a substrate having a preformed through hole and a light emitting device inserted in the through hole.

10. The optical information processing apparatus according to claim 9, wherein the light emitting device is a semiconductor light emitting diode.

11. The optical information processing apparatus according to claim 9, wherein the light emitting device is a semiconductor laser diode.

12. An optical information processing apparatus, comprising:
    a semiconductor arithmetic circuit chip; and a light emitting device array integrated onto the semiconductor arithmetic circuit chip,
    the light emitting device array comprising a substrate having a through hole and a light emitting device embedded in the through hole;
    wherein a light receiving device is provided on the semiconductor arithmetic circuit chip;
    wherein the substrate further comprises another through hole defining an optical path for the light receiving device.

13. The optical information processing apparatus according to claim 12, wherein the light emitting device is a semiconductor light emitting diode.

14. The optical information processing apparatus according to claim 12, wherein the light emitting device is a semiconductor laser diode.

15. An optical information processing apparatus, comprising:

a semiconductor arithmetic circuit chip; and a light emitting device array integrated onto the semiconductor arithmetic circuit chip, the light emitting device array comprising a substrate having a through hole and a light emitting device embedded in the through hole;

wherein the substrate is silicon;

wherein an insulator film is provided on the surface of the substrate including a side surface of the through hole.

16. The optical information processing apparatus according to claim 15, wherein the insulator film is a silicon thermal oxide film.

17. The optical information processing apparatus according to claim 15, wherein the insulator film is a silicon dioxide film.

18. The optical information processing apparatus according to claim 15, wherein the insulator film is a silicon nitride film.

19. An optical information processing apparatus, comprising:

a semiconductor arithmetic circuit chip; and a light emitting device array integrated onto the semiconductor arithmetic circuit chip, the light emitting device array comprising a substrate having a through hole and a light emitting device embedded in the through hole;

wherein the substrate is one selected from the group consisting of a plastic, a ceramic, a glass, a semiconductor, a metal and a graphite;

wherein an insulator film is provided on the surface of the substrate including a side surface of the through hole.

20. The optical information processing apparatus according to claim 19, wherein the insulator film is a silicon dioxide film.

21. The optical information processing apparatus according to claim 19, wherein the insulator film is a silicon nitride film.

* * * * *